United States Patent
Eom

(10) Patent No.: US 12,477,833 B2
(45) Date of Patent: Nov. 18, 2025

(54) ELECTRO-STATIC DISCHARGE PROTECTION DEVICE

(71) Applicant: SK hynix system ic (Wuxi) Co., Ltd., Jiangsu Province (CN)

(72) Inventor: Young Bum Eom, Gyeonggi-do (KR)

(73) Assignee: SK hynix system ic (Wuxi) Co., Ltd., Jiangsu Province (CN)

( * ) Notice: Subject to any disclaimer, the term of this patent is extended or adjusted under 35 U.S.C. 154(b) by 308 days.

(21) Appl. No.: 18/319,502

(22) Filed: May 18, 2023

(65) Prior Publication Data
US 2024/0128258 A1    Apr. 18, 2024

(30) Foreign Application Priority Data
Oct. 14, 2022 (KR) .................... 10-2022-0132756

(51) Int. Cl.
 *H10D 89/60* (2025.01)
(52) U.S. Cl.
 CPC .................... *H10D 89/60* (2025.01)
(58) Field of Classification Search
 CPC ...... H10D 89/60; H10D 8/422; H10D 62/115; H10D 62/126; H10D 89/611; H10D 89/931
 See application file for complete search history.

(56) References Cited

U.S. PATENT DOCUMENTS

| | | | | |
|---|---|---|---|---|
| 4,989,057 A * | 1/1991 | Lu | ........ | H10D 89/611 257/350 |
| 6,590,264 B2 * | 7/2003 | Ker | ........ | H10D 89/611 257/355 |
| 8,143,690 B2 * | 3/2012 | Park | ........ | H10D 84/221 257/E27.024 |
| 8,355,227 B2 * | 1/2013 | Singor | ........ | H10D 89/611 361/56 |
| 8,664,726 B2 * | 3/2014 | Chang | ........ | H10D 89/711 257/362 |
| 11,699,697 B2 * | 7/2023 | Xu | ........ | H10D 89/811 361/56 |

FOREIGN PATENT DOCUMENTS

| KR | 10-2017-0074323 A | 6/2017 |
|---|---|---|
| KR | 10-2021-0152851 A | 12/2021 |

* cited by examiner

*Primary Examiner* — Thienvu V Tran
*Assistant Examiner* — Muaamar Qahtan Al-Taweel
(74) *Attorney, Agent, or Firm* — IP & T GROUP LLP

(57) ABSTRACT

An electro-static discharge (ESD) protection device includes a first diode pair coupled between an input/output pad and a supply voltage terminal to form a first discharge path, and a second diode pair coupled between the input/output pad and a ground terminal to form a second discharge path. The first diode pair includes a first P-type diode and a second P-type diode coupled in parallel, and the second diode pair includes a first N-type diode and a second N-type diode coupled in parallel.

22 Claims, 16 Drawing Sheets

ELECTRO-STATIC DISCHARGE PROTECTION DEVICE

CROSS-REFERENCE TO RELATED APPLICATIONS

The present application claims priority under 35 U.S.C. 119(a) to Korean Patent Application No. 10-2022-0132756, filed on Oct. 14, 2022, which is incorporated herein by reference in its entirety.

BACKGROUND

1. Technical Field

Various embodiments of the present disclosure relate to an electro-static discharge protection device.

2. Related Art

In general, a semiconductor device includes an electro-static discharge protection circuit disposed between a pad and an internal circuit to protect the internal circuit from static electricity. The static electricity is generated when a pad connected to an external pin of a microchip comes in contact with a charged human body or machine and is discharged through an internal circuit, may cause chip failure. The chip failure may also be caused when the static electricity accumulated inside the semiconductor device generates an overcurrent flowing through the internal circuit. The electrostatic discharge protection circuit may prevent such a chip failure. In the development of microchips, a technique of designing a circuit that protects the microchip from electro-static discharge (ESD) stress is one of the core techniques of chip design. Such a circuit that protects the microchip against the electro-static discharge stress is referred to as an ESD protection device/circuit.

SUMMARY

An electro-static discharge protection device according to an embodiment of the present disclosure may include a first diode pair coupled between an input/output pad and a supply voltage terminal to form a first discharge path, and a second diode pair coupled between the input/output pad and a ground terminal to form a second discharge path. The first diode pair may include a first P-type diode and a second P-type diode coupled in parallel, and the second diode pair may include a first N-type diode and a second N-type diode coupled in parallel.

An electro-static discharge protection device according to an embodiment of the present disclosure may include a first diode pair coupled between an input/output pad and a supply voltage terminal to form a first discharge path, a second diode pair coupled between the input/output pad and a ground terminal to form a second discharge path, and a third diode pair coupled between the supply voltage terminal and the ground terminal to form a third discharge path. The first diode pair may include a first P-type diode and a second P-type diode coupled in parallel, and the second diode pair may include a first N-type diode and a second N-type diode coupled in parallel.

BRIEF DESCRIPTION OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed novelty, and describe various principles and advantages of those embodiments.

DETAILED DESCRIPTION

Figure 1:
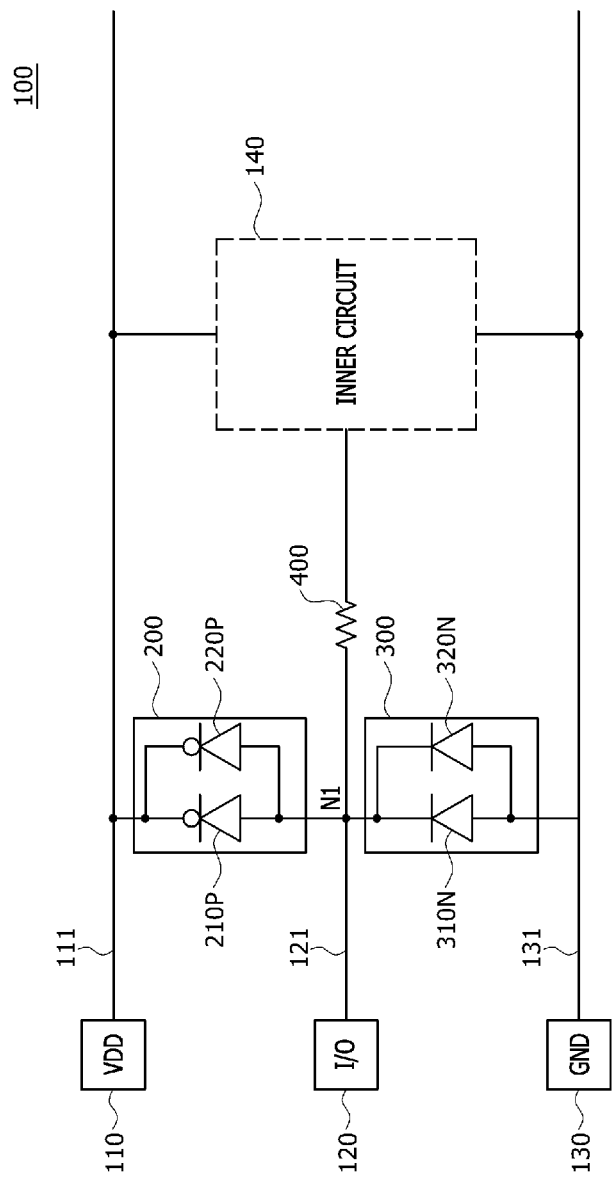
FIG. 1 is a circuit diagram illustrating an electro-static discharge (ESD) protection device according to an embodiment of the present disclosure.

In the following description of embodiments, it will be understood that the terms "first" and "second" are intended to identify elements, but not used to define a particular number or sequence of elements. In addition, when an element is referred to as being located "on," "over," "above," "under," or "beneath" another element, it is intended to mean relative position relationship, but not used to limit certain cases that the element directly contacts the other element, or at least one intervening element is present therebetween. Accordingly, the terms such as "on," "over," "above," "under," "beneath," "below," and the like that are used herein are for the purpose of describing particular embodiments only and are not intended to limit the scope of the present disclosure. Further, when an element is referred to as being "connected" or "coupled" to another element, the element may be electrically or mechanically connected or coupled to the other element directly, or may be electrically or mechanically connected or coupled to the other element indirectly with one or more additional elements therebetween.

Same reference numerals refer to same devices throughout the specification. Even though a reference numeral might not be mentioned or described with reference to a drawing, the reference numeral may be mentioned or described with reference to another drawing. In addition, even though a reference numeral might not be in a drawing, it may be illustrated in another drawing.

Various embodiments are directed to an electro-static discharge protection device.

FIG. 1 is a circuit diagram illustrating an ESD protection device 100 according to an embodiment of the present disclosure.

Referring to FIG. 1, the ESD protection device 100 may include a first diode pair 200 and a second diode pair 300. The first diode pair 200 may be disposed between a supply voltage terminal (VDD) 110 and an input/output pad (I/O) 120. Specifically, one end of the first diode pair 200 may be coupled to the input/output pad 120 through an input/output line 121. The other end of the first diode pair 200 may be coupled to the supply voltage terminal 110 through a supply voltage line 111. The second diode pair 300 may be disposed between the input/output pad 120 and a ground terminal (GND) 130. Specifically, one end of the second diode pair 300 may be coupled to the input/output pad 120 through the input/output line 121. The other end of the second diode pair 300 may be coupled to the ground terminal 130 through a ground line 131.

One end of the first diode pair 200 and one end of the second diode pair 300 may be connected to a first node N1 on the input/output line 121. A resistor 400 may be disposed between the first node N1 and an inner circuit 140. The inner circuit 140 may be a target circuit to be protected from electro-static discharge, and may be formed in a semiconductor substrate in a form of an integrated circuit or a chip. The inner circuit 140 may be coupled to the supply voltage line 111 and the ground line 131. Even if a voltage of a certain level is applied to the inner circuit 140 by electro-static discharge, the resistor 400 may decrease the level of the voltage applied to the inner circuit 140.

The first diode pair 200 may include a first P-type diode 210P and a second P-type diode 220P. The first P-type diode 210P and the second P-type diode 220P may be coupled in parallel between the first node N1 and the supply voltage line 111. Accordingly, an anode of the first P-type diode 210P and an anode of the second P-type diode 220P may be coupled in common to the first node N1. A cathode of the first P-type diode 210P and a cathode of the second P-type diode 220P may be coupled in common to the supply voltage line 111.

The second diode pair 300 may include a first N-type diode 310N and a second N-type diode 320N. The first N-type diode 310N and the second N-type diode 320N may be coupled in parallel between the ground line 131 and the first node N1. Accordingly, an anode of the first N-type diode 310N and an anode of the second N-type diode 320N may be coupled in common to the ground line 131. A cathode of the first N-type diode 310N and a cathode of the second N-type diode 320N may be coupled in common to the first node N1.

Figure 2:
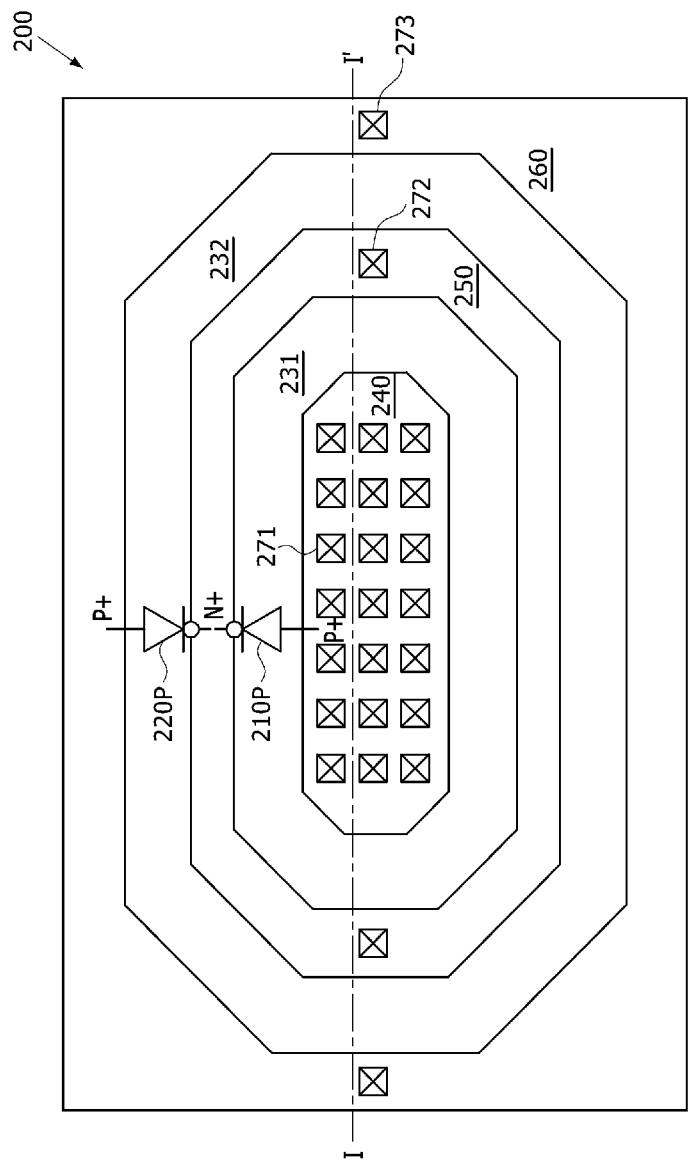
FIG. 2 is a layout view illustrating a first diode pair of the ESD protection device shown in FIG. 1.
Figure 3:
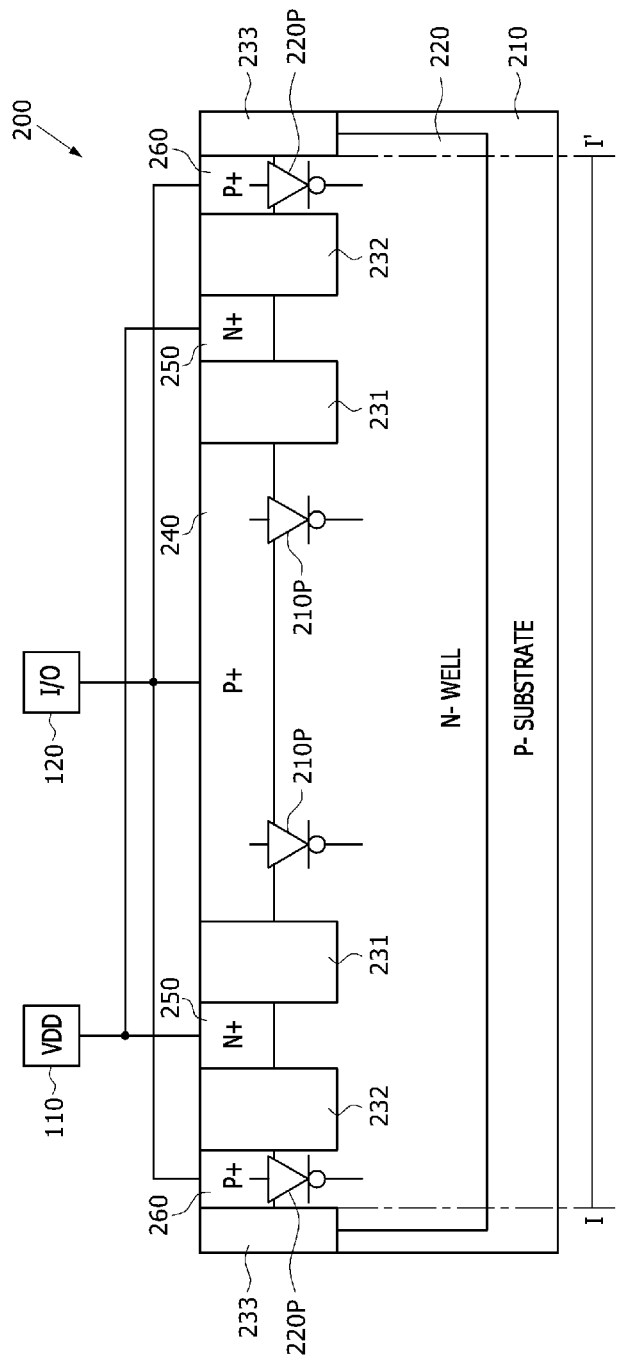
FIG. 3 is a cross-sectional view of the first diode pair taken along a line I-I' of FIG. 2.

FIG. 2 is a layout view illustrating the first diode pair 200 of the ESD protection device shown in FIG. 1. FIG. 3 is a cross-sectional view of the first diode pair 200 taken along the line I-I' of FIG. 2.

Referring to FIGS. 2 and 3, an N-type well region 220 may be disposed in an upper region of a P-type substrate 210. First, second, and third device isolation layers 231, 232, and 233 defining active regions may be disposed in an upper region of the N-type well region 220. Each of the first, second, and third device isolation layers 231, 232, and 233 may have a polygonal ring shape in a planar structure. A first P$^+$-type region 240 may be disposed in the active region surrounded by the first device isolation layer 231, that is, in an upper central region of the N-type well region 220. A first N$^+$-type region 250 may be disposed in the active region between the first device isolation layer 231 and the second device isolation layer 232. A second P$^+$-type region 260 may be disposed in the active region between the second device isolation layer 232 and the third device isolation layer 233.

At least one first contact 271 may be disposed on the first P$^+$-type region 240. At least one second contact 272 may be disposed on the first N$^+$-type region 250. At least one third contact 273 may be disposed on the second P$^+$-type region 260. The first P$^+$-type region 240 may be coupled to the input/output pad 120 through the first contact 271 And the second P$^+$-type region 260 may be coupled to the input/output pad 120 through the third contact 273. The first N$^+$-type region 250 may be coupled to the supply voltage terminal 110 through the second contact 272. Although not illustrated in the drawings, the P-type substrate 210 and the N-type well region 220 may be coupled to the ground terminal 130 and the supply voltage terminal 110, respectively.

The first P$^+$-type region 240, and the N-type well region 220 and first N$^+$-type region 250 may constitute the first P-type diode 210P. The second P$^+$-type region 260, and the N-type well region 220 and first N$^+$-type region 250 may constitute the second P-type diode 220P. The first P$^+$-type region 240 may constitute the anode of the first P-type diode 210P. The second Pt-type region 260 may constitute the anode of the second P-type diode 220P. The N-type well region 220 and the first N$^+$-type region 250 may constitute the cathode of the first P-type diode 210P and the cathode of the second P-type diode 220P.

Figure 4:
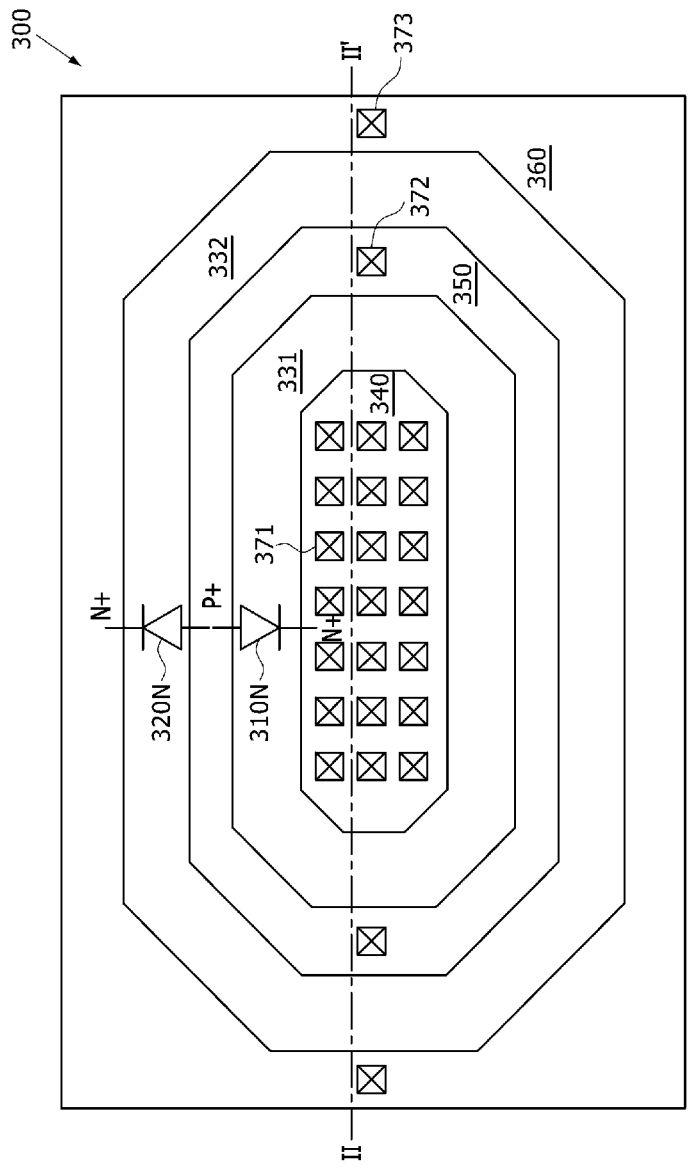
FIG. 4 is a layout view illustrating a second diode pair of the ESD protection device shown in FIG. 1.

FIG. 4 is a layout view illustrating the second diode pair 300 of the ESD protection device shown in FIG. 1. In addition, FIG. 5 is a cross-sectional view of the second diode pair 300 taken along the line II-II' of FIG. 4.

Figure 5:
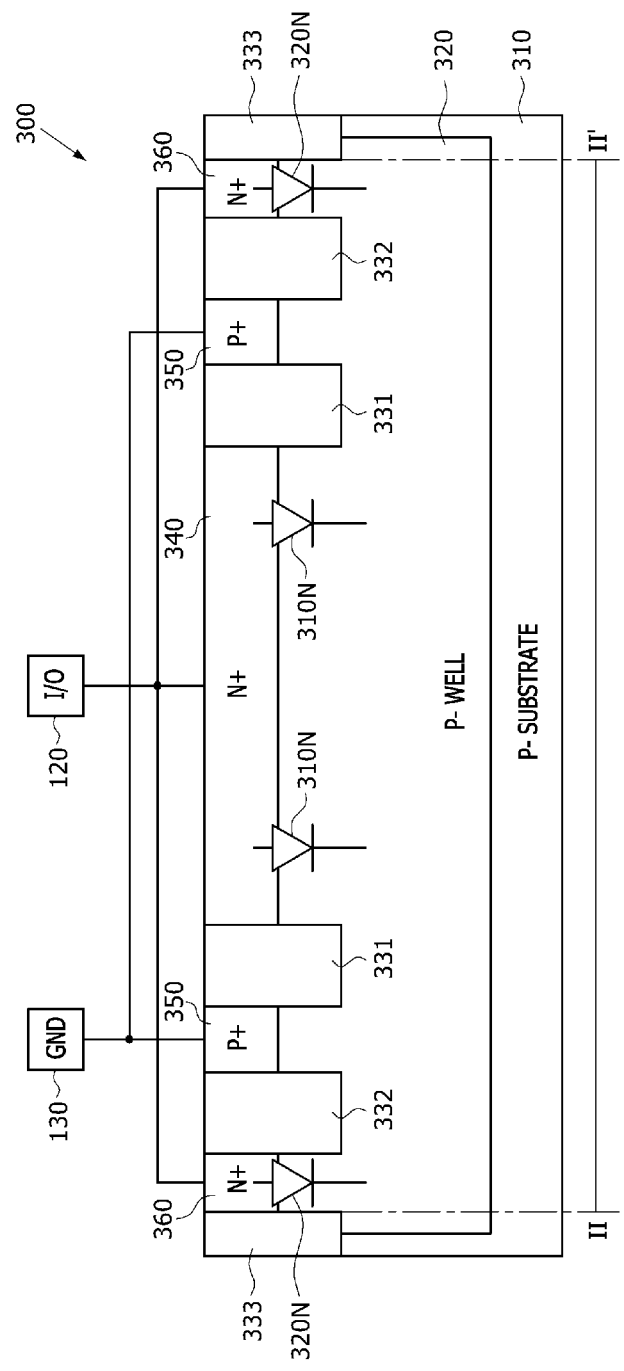
FIG. 5 is a cross-sectional view of the second diode pair taken along a line II-II' of FIG. 4.

Referring to FIGS. 4 and 5, a first P-type well region 320 may be disposed in an upper region of the P-type substrate 210. Fourth, fifth, and sixth device isolation layers 331, 332, and 333 defining active regions may be disposed in an upper region of the first P-type well region 320. Each of the fourth, fifth, and sixth device isolation layers 331, 332, and 333 may have a polygonal ring shape in a planar structure. A second N$^+$-type region 340 may be disposed in the active region surrounded by the fourth isolation layer 331, that is, in an upper central region of the first P-type well region 320. A third P$^+$-type region 350 may be disposed in the active region between the fourth device isolation layer 331 and the fifth device isolation layer 332. A third N$^+$-type region 360 may be disposed in the active region between the fifth device isolation layer 332 and the sixth device isolation layer 333.

At least one fourth contact 371 may be disposed on the second N$^+$-type region 340. At least one fifth contact 372 may be disposed on the third P$^+$-type region 350. At least one sixth contact 373 may be disposed on the third N$^+$-type region 360. The second N$^+$-type region 340 may be coupled to the input/output pad 120 through the fourth contact 371. And the third N$^+$-type region 360 may be coupled to the input/output pad 120 through the sixth contact 373. The third P$^+$-type region 350 may be coupled to the ground terminal 130 through the fifth contact 372. Although not illustrated in the drawings, both the P-type substrate 310 and the first P-type well region 320 may be coupled to the ground terminal 130.

The first P-type well region 320 and third Pt-type region 350, and the second N$^+$-type region 340 may constitute the first N-type diode 310N. The first P-type well region 320 and third P$^+$-type region 350, and the third N$^+$-type region 360 may constitute the second N-type diode 320N. The second N$^+$-type region 340 may constitute the anode of the first N-type diode 310N. The third N$^+$-type region 360 may constitute the anode of the second N-type diode 320N. The first P-type well region 320 and the third P$^+$-type region 350 may constitute the cathode of the first N-type diode 320N and the cathode of the second N-type diode 320N.

FIGS. 6 to 9 are circuit diagrams illustrating the operations of the ESD protection device 100 of FIG. 1.

Figure 6:
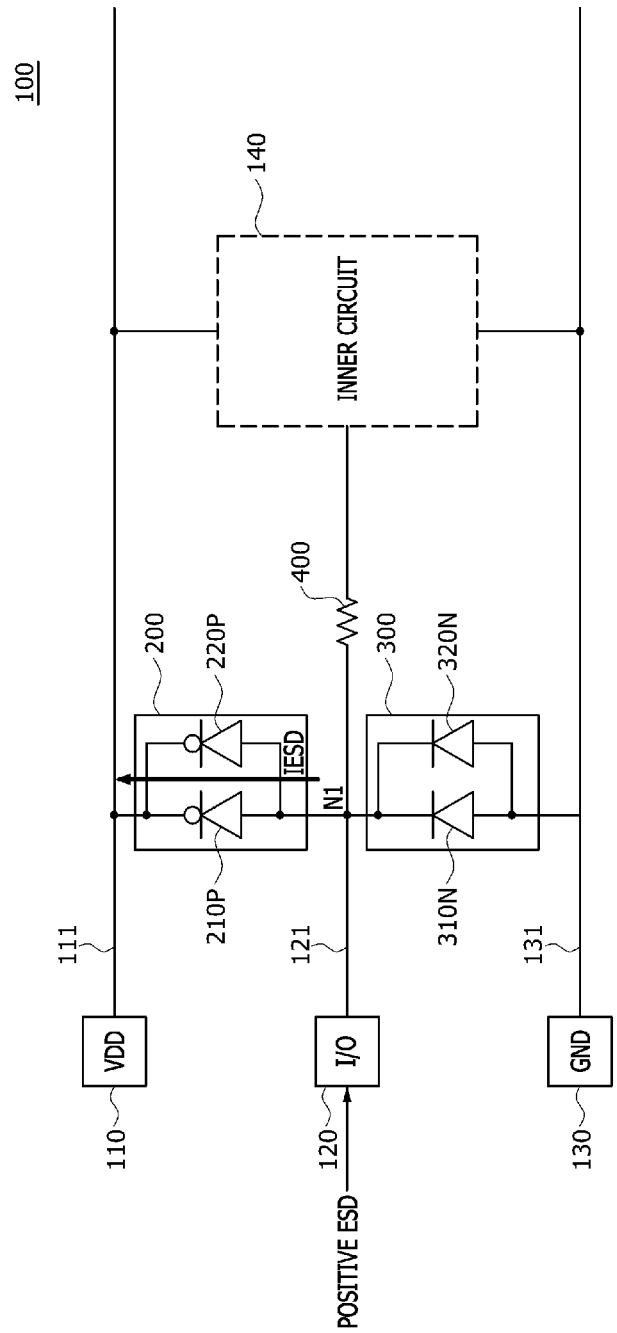
FIGS. 6 to 9 are circuit diagrams for describing the operations of the ESD protection device shown in FIG. 1.

First, referring to FIG. 6, when positive electro-static discharge (ESD) having a potential higher than that of the supply voltage line 111 is applied to the input/output pad 120, an ESD current IESD may flow toward the supply voltage line 111 through the first diode pair 200. In this case, the first P-type diode 210P and the second P-type diode 220P that constitute the first diode pair 200 may operate in a forward direction. A first discharge path between the input/output pad 120 and the supply voltage terminal 110 may include a discharge path via the first P-type diode 210P and a discharge path via the second P-type diode 220P. Accordingly, the ESD current IESD may flow through the discharge path via the first P-type diode 210P, and may also flow through the discharge path via the second P-type diode 220P. In the cross-sectional structure of FIG. 3, the ESD current may flow from the input/output pad 120 to the first $P^+$-type region 240 and the second $P^+$-type region 260. The ESD current entering the first $P^+$-type region 240 may flow out to the supply voltage terminal 110 through the N-type well region 220 and the first $N^+$-type region 250. In addition, the ESD current entering the second $P^+$-type region 260 may also flow out to the supply voltage terminal 110 through the N-type well region 220 and the first $N^+$-type region 250.

Figure 7:
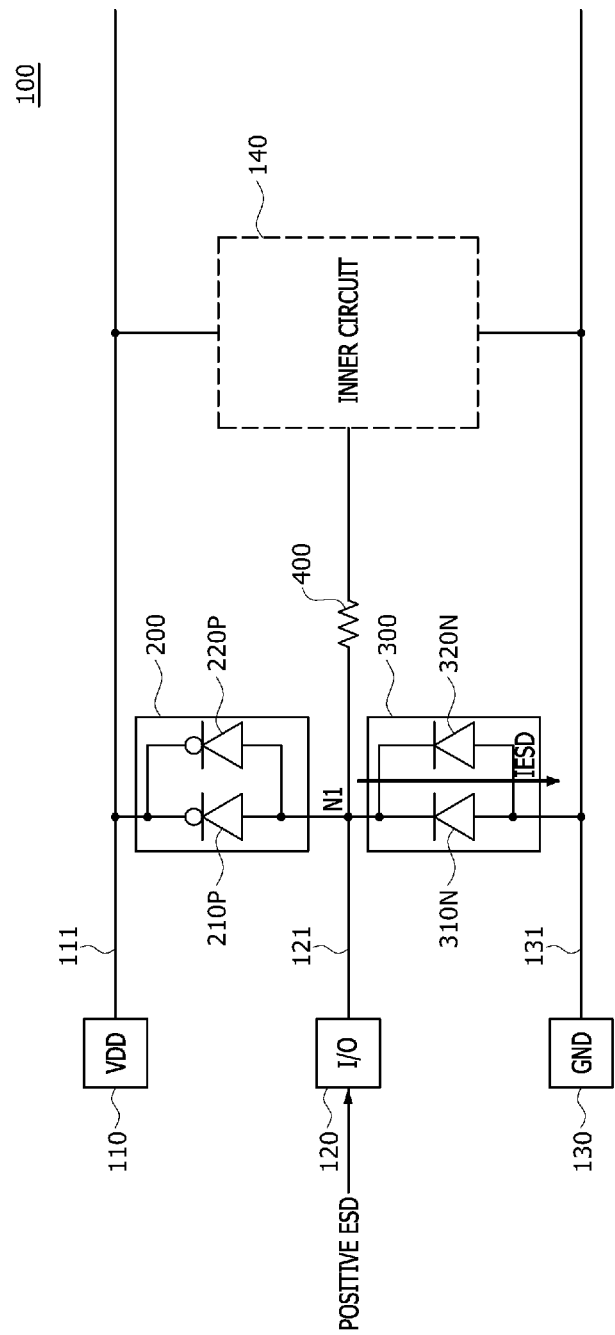

Next, referring to FIG. 7, when positive ESD having a potential higher than that of the ground line 131 is applied to the input/output pad 120, the ESD current IESD may flow toward the ground line 131 through the second diode pair 300. In this case, the first N-type diode 310N and the second N-type diode 320N that constitute the second diode pair 300 may both be broken-down and operate in a reverse direction. A second discharge path between the input/output pad 120 and the ground terminal 130 may include a discharge path via the first N-type diode 310N and a discharge path via the second N-type diode 320N. Accordingly, the ESD current IESD may flow through the discharge path via the first N-type diode 310B, and may also flow through the discharge path via the second N-type diode 320N. In the cross-sectional structure of FIG. 5, the ESD current may flow from the input/output pad 120 to the second $N^+$-type region 340 and the third $N^+$-type region 360. The ESD current entering the second $N^+$-type region 340 may flow out to the ground terminal 130 through the first P-type well region 320 and the third $P^+$-type region 350. In addition, the ESD current entering the third $N^+$-type region 360 may also flow out to the ground terminal 130 through the first P-type well region 320 and the third $P^+$-type region 350.

Figure 8:
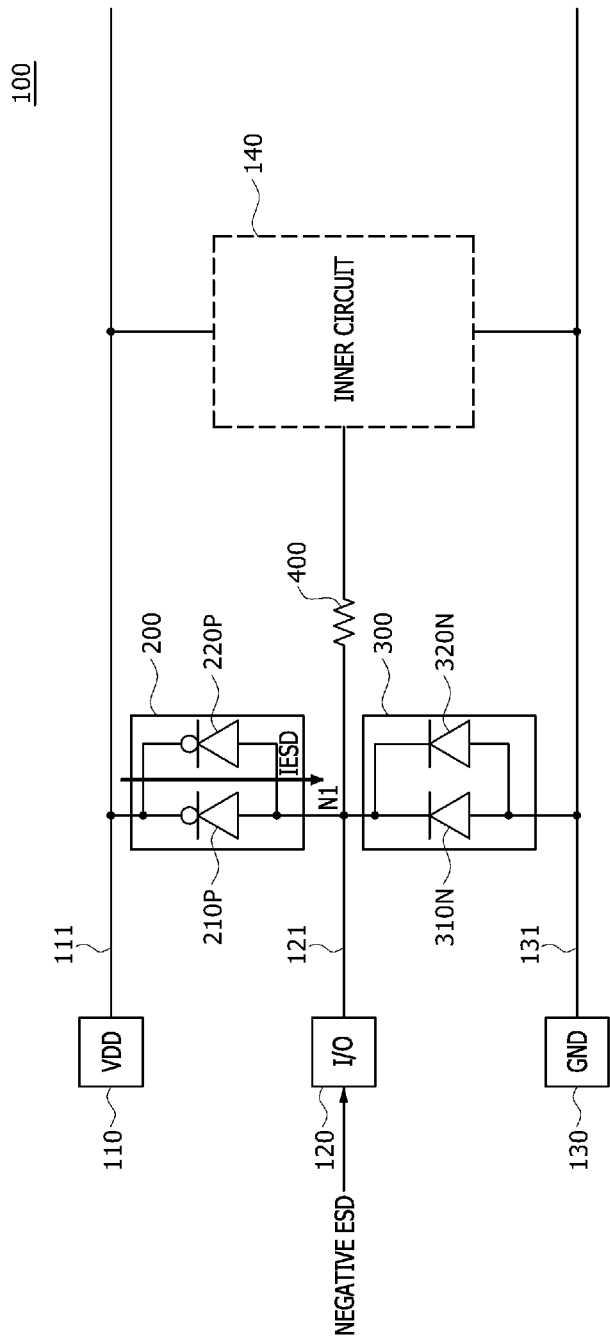

Next, referring to FIG. 8, when negative ESD having a potential lower than that of the supply voltage line 111 is applied to the input/output pad 120, the ESD current IESD may flow toward the input/output line 121 through the first diode pair 200. In this case, the first P-type diode 210P and the second P-type diode 220P that constitute the first diode pair 200 may be broken-down and operate in a reverse direction. As described with reference to FIG. 6, the ESD current IESD may flow through the discharge path via the first P-type diode 210P and may also flow through the discharge path via the second P-type diode 220P. In the cross-sectional structure of FIG. 3, the ESD current may flow from the supply voltage terminal 110 to the N-type well region 220 through the first $N^+$-type region 250. The ESD current entering the N-type well region 220 may flow out to the input/output pad 120 through the first $P^+$-type region 240 and the second $P^+$-type region 260.

Figure 9:
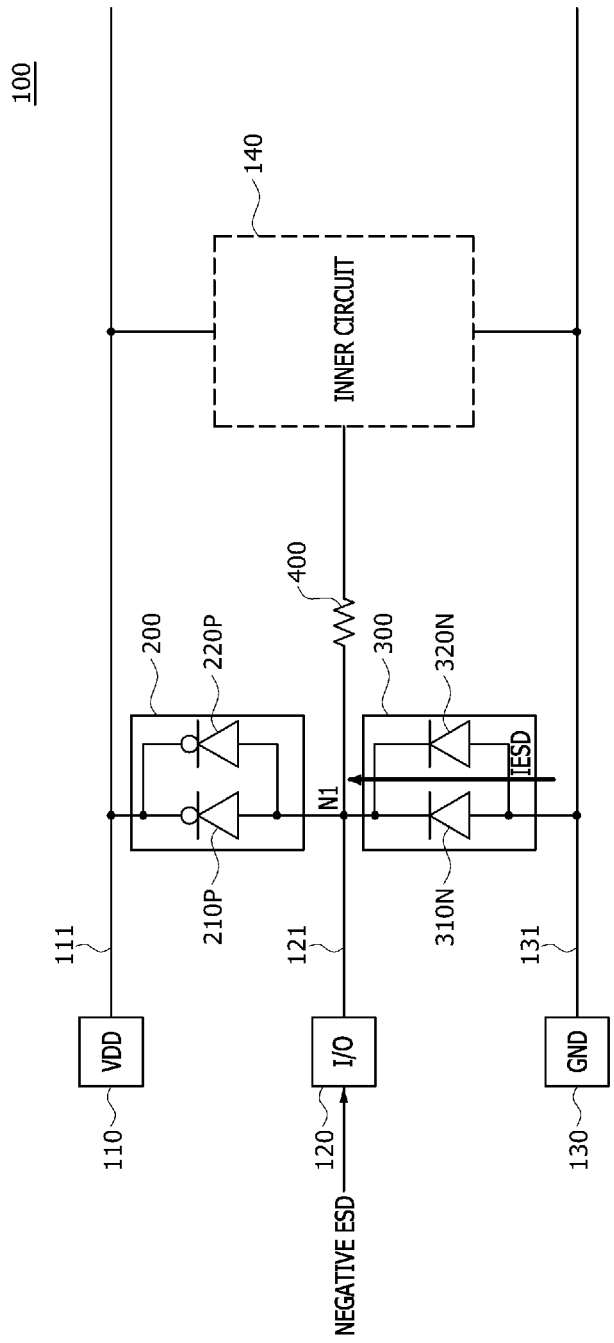

Next, referring to FIG. 9, when negative ESD having a potential lower than that of the ground line 131 is applied to the input/output pad 120, the ESD current IESD may flow toward the input/output pad 120 through the second diode pair 300. In this case, both the first N-type diode 310N and the second N-type diode 320N that constitute the second diode pair 300 may operate in the forward direction. The ESD current IESD may flow through the discharge path via the first N-type diode 310N, and may also flow through the discharge path via the second N-type diode 320N. In the cross-sectional structure of FIG. 5, the ESD current may flow from the ground terminal 130 to the first P-type well region 320 through the third $P^+$-type region 350. The ESD current entering the first P-type well region 320 may flow out to the input/output pad 120 through the second $N^+$-type region 340 and the third $N^+$-type region 360.

Figure 10:
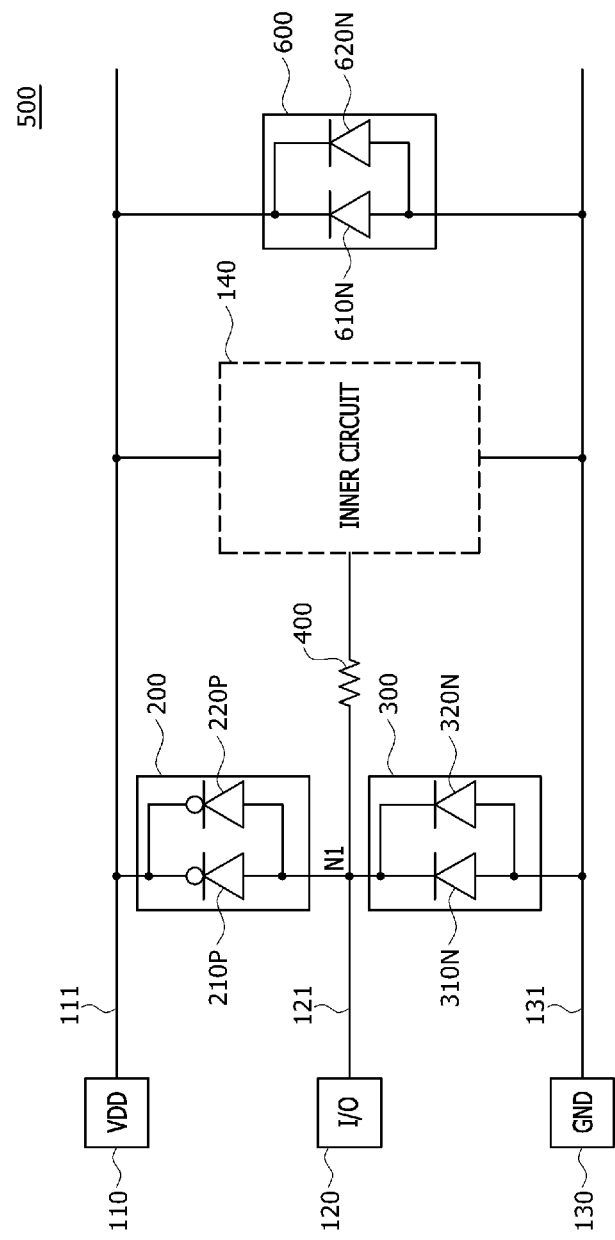
FIG. 10 is a circuit diagram illustrating an ESD protection device according to another embodiment of the present disclosure.

FIG. 10 is a circuit diagram illustrating an ESD protection device 500 according to another embodiment of the present disclosure. In FIG. 10, the same reference numerals as those in FIG. 1 denote the same components, and redundant descriptions of the contents described with reference to FIG. 1 will be omitted below.

Referring to FIG. 10, when comparing with the ESD protection device 100 of FIG. 1, the ESD protection device 500 may further include a third diode pair 600 disposed between the supply voltage line 111 and the ground line 131. Specifically, one end of the third diode pair 600 may be coupled to a ground terminal 130 through the ground line 131. The other end of the third diode pair 600 may be coupled to a supply voltage terminal 110 through the supply voltage line 111. The third diode pair 600 may include a third N-type diode 610N and a fourth N-type diode 620N. The third N-type diode 610N and the fourth N-type diode 620N may be coupled in parallel between the ground line 131 and the supply voltage line 111. Accordingly, an anode of the third N-type diode 610N and an anode of the fourth N-type diode 620N may be coupled in common to the ground line 131. A cathode of the third N-type diode 610N and a cathode of the fourth N-type diode 620N may be coupled in common to the supply voltage line 111.

Figure 11:
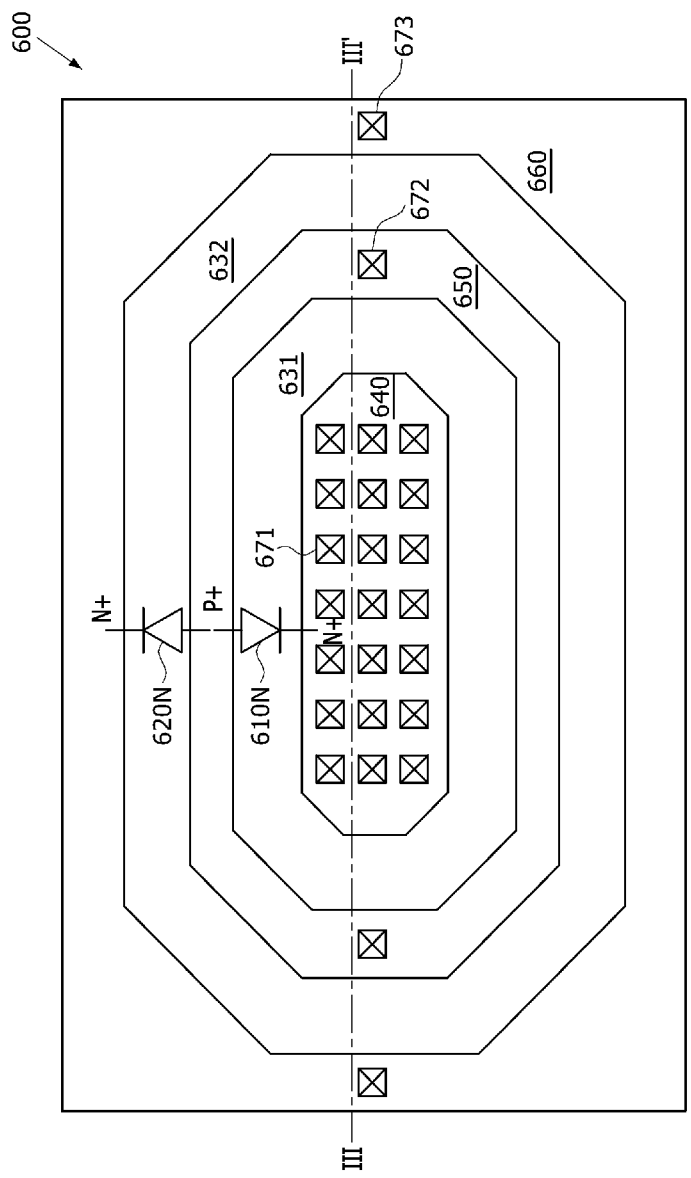
FIG. 11 is a layout view illustrating a third diode pair of the ESD protection device shown in FIG. 10.

FIG. 11 is a layout view illustrating the third diode pair 600 of the ESD protection device shown in FIG. 10. In addition, FIG. 12 is a cross-sectional view of the third diode pair 600 taken along a line III-III' of FIG. 11.

Figure 12:
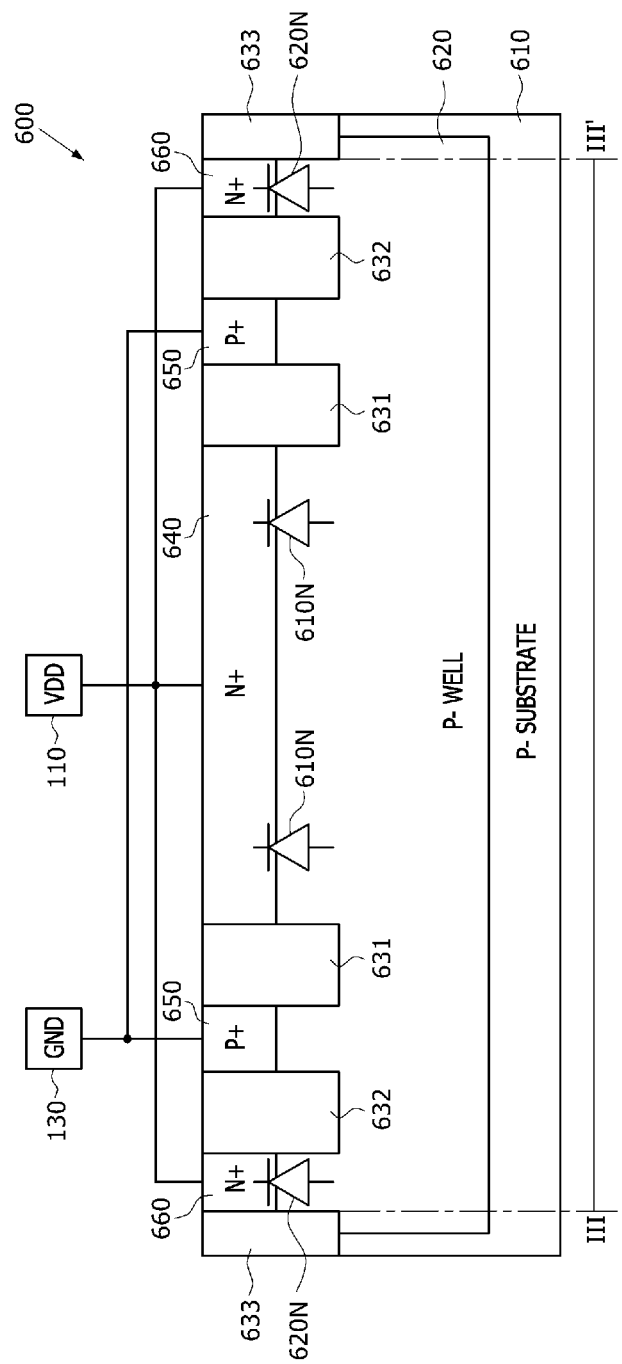
FIG. 12 is a cross-sectional view of the third diode pair taken along a line III-III' of FIG. 11.

Referring to FIGS. 11 and 12, a second P-type well region 620 may be disposed in an upper region of a P-type substrate 610. Seventh, eighth, and ninth device isolation layers 631, 632, and 633 defining active regions may be disposed in an upper region of the second P-type well region 620. Each of the seventh, eighth, and ninth device isolation layers 631, 632, and 633 may have a polygonal ring shape in a planar structure. A fourth $N^+$-type region 640 may be disposed in the active region surrounded by the seventh isolation layer 631, that is, in an upper central region of the second P-type well region 620. A fourth $P^+$-type region 650 may be disposed in the active region between the seventh isolation layer 631 and the eighth isolation layer 632. A fifth $N^+$-type region 660 may be disposed in the active region between the eighth isolation layer 632 and the ninth isolation layer 633.

At least one seventh contact 671 may be disposed on the fourth $N^+$-type region 640. At least one eighth contact 672 may be disposed on the fourth $P^+$-type region 650. At least one ninth contact 673 may be disposed on the fifth $N^+$-type region 660. The fourth $N^+$-type region 640 may be coupled to the supply voltage terminal 110 through the seventh contact 671. And the fifth $N^+$-type region 660 may be coupled to the supply voltage terminal 110 through the ninth contact 673. The fourth $P^+$-type region 650 may be coupled to the ground terminal 130 through the eighth contact 672. Both the P-type substrate 610 and the second P-type well region 620 may be coupled to the ground terminal 130.

The second P-type well region 620 and fourth $P^+$-type region 650, and the fourth $N^+$-type region 640 may constitute the third N-type diode 610N. The second P-type well region 620 and fourth P⁺-type region 650, and the fifth N⁺-type region 660 may constitute the fourth N-type diode 620N. The fourth N⁺-type region 640 may constitute a cathode of the third N-type diode 610N. The fifth N⁺-type region 660 may constitute a cathode of the fourth N-type diode 620N. The second P-type well region 620 and the fourth P⁺-type region 650 may constitute an anode of the third N-type diode 620N and an anode of the fourth N-type diode 620N.

FIGS. 13 to 16 are circuit diagrams illustrating the operations of the ESD protection device 500 of FIG. 10. In the ESD protection device 500 according to the present embodiment, the operations when positive ESD having a potential higher than that of the supply voltage line 111 and negative ESD having a potential lower than that of the supply voltage line 111 are applied to the input/output pad 120 may be the same as the operations described above with reference to FIGS. 6 and 8. In addition, the operations when the positive ESD having a potential higher than that of the ground line 131 and the negative ESD having a potential lower than that of the ground line 131 are applied to the input/output pad 120 may be the same as the operations described above with reference to FIGS. 7 and 9.

Figure 13:
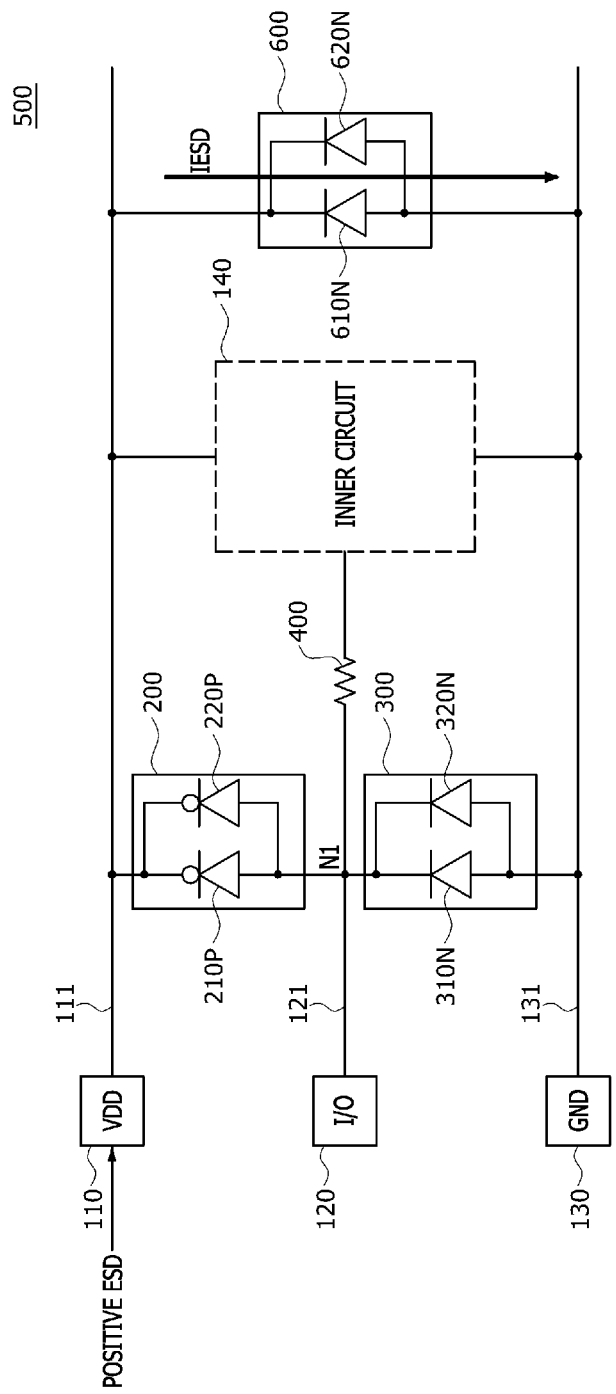
FIGS. 13 to 16 are circuit diagrams for describing the operations of the ESD protection device of FIG. 10.

First, referring to FIG. 13, when positive ESD having a potential higher than that of the ground line 131 is applied to the supply voltage terminal 110, an ESD current IESD may flow toward the ground line 131 through the third diode pair 600. In this case, both the third N-type diode 610N and the fourth N-type diode 620N that constitute the third diode pair 600 may be broken down and operate in a reverse direction. A third discharge path between the supply voltage terminal 110 and the ground terminal 130 may include a discharge path via the third N-type diode 610N and a discharge path via the fourth N-type diode 620N. Accordingly, the ESD current IESD may flow through the discharge path via the third N-type diode 610N, and may also flow through the discharge path via the fourth N-type diode 620N. In the cross-sectional structure of FIG. 12, the ESD current may flow from the supply voltage terminal 110 to the fourth N⁺-type region 640 and the fifth N⁺-type region 660. The ESD current entering the fourth N⁺-type region 640 may flow out to the ground terminal 130 through the second P-type well region 620 and the fourth P⁺-type region 650. In addition, the ESD current entering the fifth N⁺-type region 660 may also flow out to the ground terminal 130 through the second P-type well region 620 and the fourth P⁺-type region 650.

Figure 14:
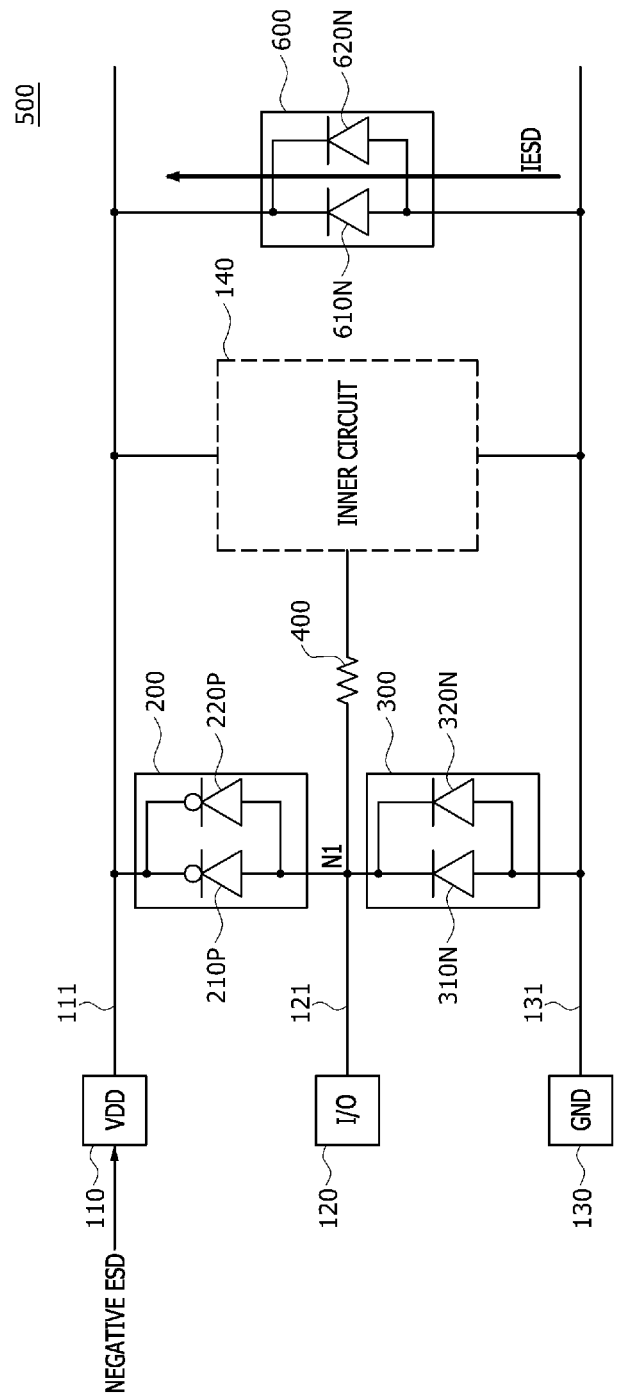

Next, referring to FIG. 14, when negative ESD having a potential lower than that of the ground line 131 is applied to the supply voltage terminal 110, the ESD current IESD may flow from the ground line 131 to the supply voltage line 111 through the third diode pair 600. In this case, both the third N-type diode 610N and the fourth N-type diode 620N that constitute the third diode pair 600 may operate in a forward direction. The ESD current IESD may flow through the discharge path via the third N-type diode 610N, and may also flow through the discharge path via the fourth N-type diode 620N. In the cross-sectional structure of FIG. 12, the ESD current may flow from the ground terminal 130 to the second P-type well region 620 through the fourth P⁺-type region 650. The ESD current entering the second P-type well region 620 may flow out to the supply voltage terminal 110 through the fourth N⁺-type region 640 and the fifth N⁺-type region 660.

Figure 15:
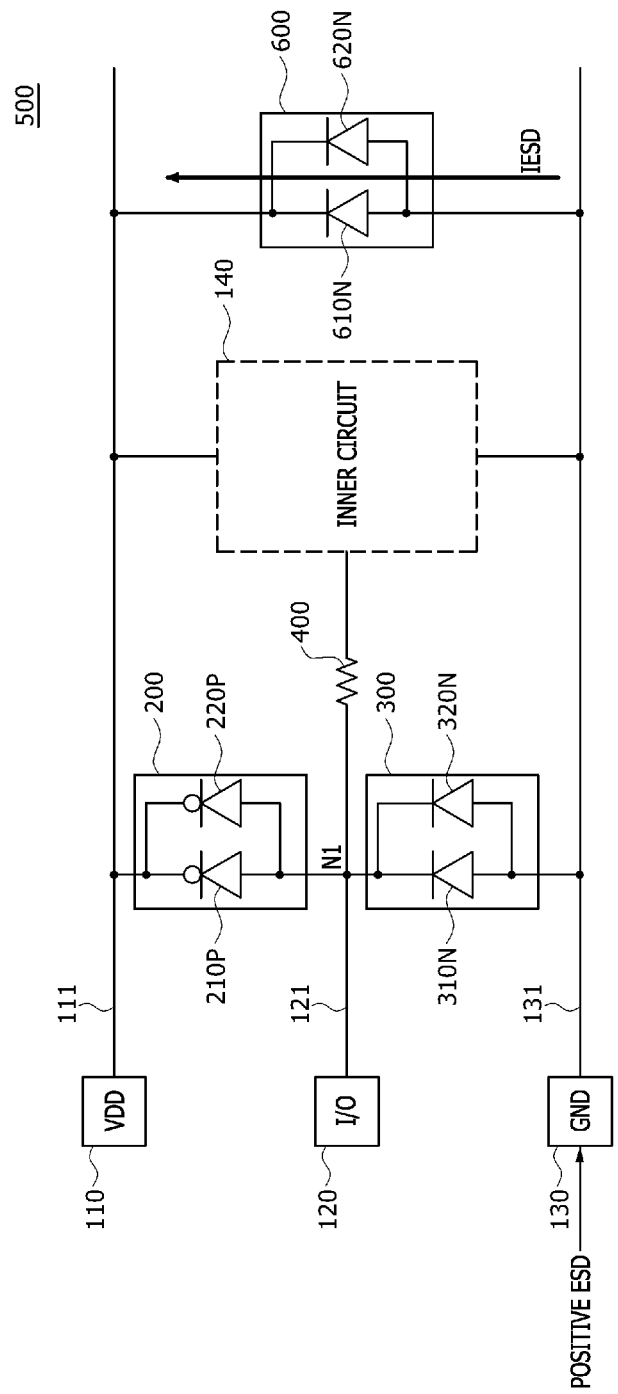

Next, referring to FIG. 15, when positive ESD having a potential higher than that of the supply voltage line 111 is applied to the ground terminal 130, the ESD current IESD may flow from the ground line 131 to the supply voltage line 111 through the third diode pair 600. In this case, both the third N-type diode 610N and the fourth N-type diode 620N that constitute the third diode pair 600 may operate in a forward direction. The ESD current IESD may flow through the discharge path via the third N-type diode 610N, and may also flow through the discharge path via the fourth N-type diode 620N. In the cross-sectional structure of FIG. 12, the ESD current may flow from the ground terminal 130 to the second P-type well region 620 through the fourth P⁺-type region 650. The ESD current entering the second P-type well region 620 may flow out to the supply voltage terminal 110 through the fourth N⁺-type region 640 and the fifth N⁺-type region 660.

Figure 16:
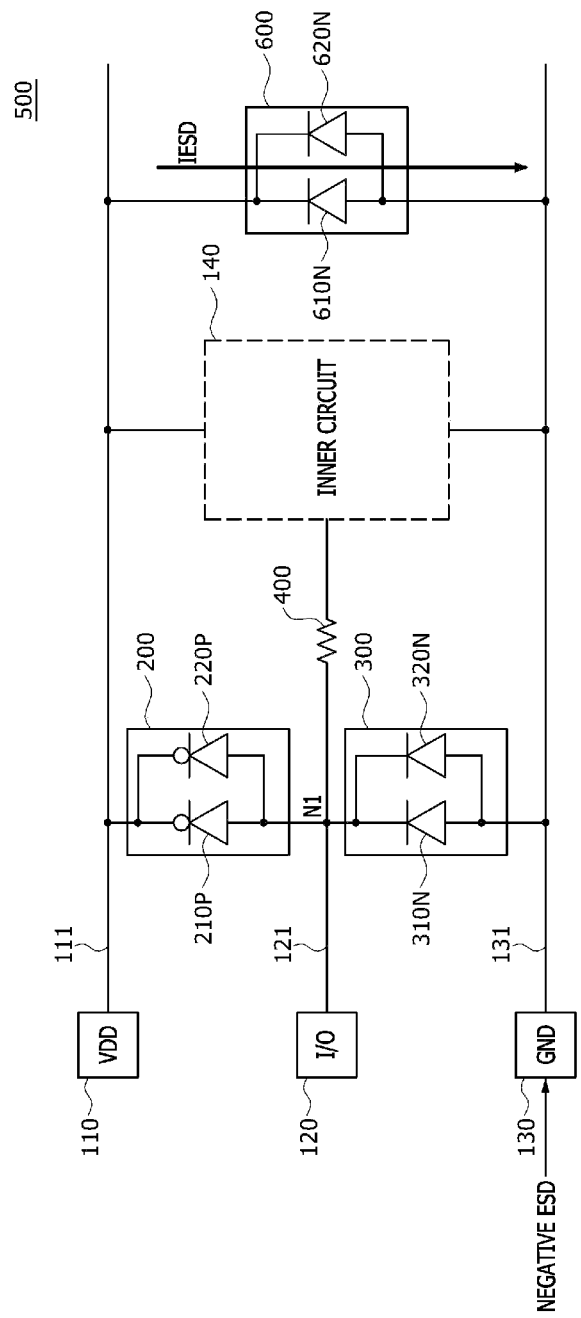

Next, referring to FIG. 16, when negative ESD having a potential lower than that of the supply voltage line 111 is applied to the ground terminal 130, the ESD current IESD may flow from the supply voltage line 111 to the ground line 131 through the third diode pair 600. In this case, both the third N-type diode 610N and the fourth N-type diode 620N that constitute the third diode pair 600 may be broken down and operate in a reverse direction. The ESD current IESD may flow through the discharge path via the third N-type diode 610N, and may also flow through the discharge path via the fourth N-type diode 620N. In the cross-sectional structure of FIG. 12, the ESD current may flow from the supply voltage terminal 110 to the fourth N⁺-type region 640 and the fifth N⁺-type region 660. The ESD current entering the fourth N⁺-type region 640 may flow out to the ground terminal 130 through the second P-type well region 620 and the fourth P⁺-type region 650. In addition, the ESD current entering the fifth N⁺-type region 660 may also flow out to the ground terminal 130 through the second P-type well region 620 and the fourth P⁺-type region 650.

According to various embodiments of the present disclosure, provided is an electro-static discharge protection device capable of processing a larger amount of discharge current than other devices having the same area.

A limited number of possible embodiments for the present teachings have been presented above for illustrative purposes. Those of ordinary skill in the art will appreciate that various modifications, additions, and substitutions are possible. While the present disclosure contains many specifics, these should not be construed as limitations on the scope of the present teachings or of what may be claimed, but rather as descriptions of features that may be specific to particular embodiments. Certain features that are described in the present disclosure in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

What is claimed is:

1. An electro-static discharge (ESD) protection device comprising:
   a first diode pair coupled between an input/output pad and a supply voltage terminal to form a first discharge path; and
   a second diode pair coupled between the input/output pad and a ground terminal to form a second discharge path, wherein the first diode pair includes a first P-type diode and a second P-type diode coupled in parallel,
wherein the second diode pair includes a first N-type diode and a second N-type diode coupled in parallel, and
wherein the first diode pair includes:
an N-type well region;
a first $P^+$-type region disposed in an upper central region of the N-type well region;
a first $N^+$-type region disposed to surround the first $P^+$-type region; and
a second $P^+$-type region disposed to surround the first $N^+$-type region.

2. The ESD protection device of claim 1,
wherein an anode of the first P-type diode and an anode of the second P-type diode are coupled to the input/output pad, and
wherein a cathode of the first P-type diode and a cathode of the second P-type diode are coupled to the supply voltage terminal.

3. The ESD protection device of claim 1,
wherein an anode of the first N-type diode and an anode of the second N-type diode are coupled to the ground terminal, and
wherein a cathode of the first N-type diode and a cathode of the second N-type diode are coupled to the input/output pad.

4. The ESD protection device of claim 1,
wherein the N-type well region is disposed in an upper region of a P-type substrate, and
wherein the N-type well region and the P-type substrate are coupled to the supply voltage terminal and the ground terminal, respectively.

5. The ESD protection device of claim 4,
wherein the first $P^+$-type region and the second $P^+$-type region are coupled to the input/output pad, and
wherein the first $N^+$-type region is coupled to the supply voltage terminal.

6. The ESD protection device of claim 1,
wherein the first $P^+$-type region constitutes an anode of the first P-type diode,
wherein the second $P^+$-type region constitutes an anode of the second P-type diode, and
wherein the N-type well region and the first $N^+$-type region constitute a cathode of the first P-type diode and a cathode of the second P-type diode.

7. The ESD protection device of claim 1, further comprising:
a first device isolation layer disposed between the first $P^+$-type region and the first $N^+$-type region to surround the first $P^+$-type region; and
a second device isolation layer disposed between the first $N^+$-type region and the second $P^+$-type region to surround the first $N^+$-type region.

8. The ESD protection device of claim 1, wherein the second diode pair includes:
a first P-type well region;
a second $N^+$-type region disposed in an upper central region of the first P-type well region;
a third $P^+$-type region disposed to surround the second $N^+$-type region; and
a third $N^+$-type region disposed to surround the third $P^+$-type region.

9. The ESD protection device of claim 8,
wherein the first P-type well region is disposed in a P-type substrate, and
wherein the first P-type well region and the P-type substrate are coupled to the ground terminal.

10. The ESD protection device of claim 9,
wherein the second $N^+$-type region and the third $N^+$-type region are coupled to the input/output pad, and
wherein the third $P^+$-type region is coupled to the ground terminal.

11. The ESD protection device of claim 8,
wherein the second $N^+$-type region constitutes an anode of the first N-type diode,
wherein the third $N^+$-type region constitutes an anode of the second N-type diode, and
wherein the first P-type well region and the third $P^+$-type region constitute a cathode of the first N-type diode and a cathode of the second N-type diode.

12. The ESD protection device of claim 8, further comprising:
a third device isolation layer disposed between the second $N^+$-type region and the third $P^+$-type region to surround the second $N^+$-type region; and
a fourth device isolation layer disposed between the third $P^+$-type region and the third $N^+$-type region to surround the third $P^+$-type region.

13. An electro-static discharge (ESD) protection device comprising:
a first diode pair coupled between an input/output pad and a supply voltage terminal to form a first discharge path;
a second diode pair coupled between the input/output pad and a ground terminal to from a second discharge path; and
a third diode pair coupled between the supply voltage terminal and the ground terminal to form a third discharge path,
wherein the first diode pair includes a first P-type diode and a second P-type diode coupled in parallel,
wherein the second diode pair includes a first N-type diode and a second N-type diode coupled in parallel, and
wherein the first diode pair includes:
a first N-type well region;
a first $P^+$-type region disposed in an upper central region of the first N-type well region;
a first $N^+$-type region disposed to surround the first $P^+$-type region; and
a second $P^+$-type region disposed to surround the first $N^+$-type region.

14. The ESD protection device of claim 13, wherein the third diode pair includes a third N-type diode and a fourth N-type diode coupled in parallel.

15. The ESD protection device of claim 14,
wherein an anode of the third N-type diode and an anode of the fourth N-type diode are coupled to the ground terminal, and
wherein a cathode of the third N-type diode and a cathode of the fourth N-type diode are coupled to the supply voltage terminal.

16. The ESD protection device of claim 14,
wherein the second diode pair includes:
a first P-type well region;
a second $N^+$-type region disposed in an upper central region of the first P-type well region;
a third $P^+$-type region disposed to surround the second $N^+$-type region; and
a third $N^+$-type region disposed to surround the third $P^+$-type region.

17. The ESD protection device of claim 16, wherein the third diode pair includes:

a second P-type well region;
a fourth N$^+$-type region disposed in an upper central region of the second P-type well region;
a fourth P$^+$-type region disposed to surround the fourth N$^+$-type region; and
a fifth N$^+$-type region disposed to surround the fourth P$^+$-type region.

18. The ESD protection device of claim 17,
wherein the second P-type well region is disposed in an upper region of a P-type substrate, and
wherein the second P-type well region and the P-type substrate are coupled to the ground terminal.

19. The ESD protection device of claim 17,
wherein the fourth N$^+$-type region and the fifth N$^+$-type region are coupled to the supply voltage terminal, and
wherein the fourth P$^+$-type region is coupled to the ground terminal.

20. The ESD protection device of claim 17,
wherein the fourth N$^+$-type region constitutes a cathode of the third N-type diode,
wherein the fifth N$^+$-type region constitutes a cathode of the fourth N-type diode, and
wherein the second P-type well region and the fourth P$^+$-type region constitute an anode of the third N-type diode and an anode of the fourth N-type diode.

21. The ESD protection device of claim 17, further comprising:
a first device isolation layer disposed between the first P$^+$-type region and the first N$^+$-type region to surround the first P$^+$-type region;
a second device isolation layer disposed between the first N$^+$-type region and the second P$^+$-type region to surround the first N$^+$-type region;
a third device isolation layer disposed between the second N$^+$-type region and the third P$^+$-type region to surround the second N$^+$-type region; and
a fourth device isolation layer disposed between the third P$^+$-type region and the third N$^+$-type region to surround the third P$^+$-type region.

22. The ESD protection device of claim 21, further comprising:
a fifth device isolation layer disposed between the fourth N$^+$-type region and the fourth P$^+$-type region to surround the fourth N$^+$-type region; and
a sixth device isolation layer disposed between the fourth P$^+$-type region and the fifth N$^+$-type region to surround the fourth P$^+$-type region.

* * * * *